(12) United States Patent
Doris et al.

(10) Patent No.: US 8,018,005 B2
(45) Date of Patent: Sep. 13, 2011

(54) CMOS (COMPLEMENTARY METAL OXIDE SEMICONDUCTOR) DEVICES HAVING METAL GATE NFETS AND POLY-SILICON GATE PFETS

(75) Inventors: Bruce Bennett Doris, Brewster, NY (US); William K. Henson, Beacon, NY (US); Richard Stephen Wise, Newburgh, NY (US); Hongwen Yan, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/823,225

(22) Filed: Jun. 25, 2010

(65) Prior Publication Data
US 2010/0258875 A1    Oct. 14, 2010

Related U.S. Application Data

(62) Division of application No. 12/026,793, filed on Feb. 6, 2008, now Pat. No. 7,749,830.

(51) Int. Cl.
*H01L 21/70* (2006.01)
(52) U.S. Cl. ................. 257/369; 257/E21.632; 438/199
(58) Field of Classification Search .................. 257/369, 257/E21.632; 438/199
See application file for complete search history.

(56) References Cited

U.S. PATENT DOCUMENTS

| | | | |
|---|---|---|---|
| 6,902,969 B2 | 6/2005 | Adetutu et al. | |
| 7,495,298 B2 | 2/2009 | Hayashi et al. | |
| 2007/0117331 A1* | 5/2007 | Khamankar et al. | 438/287 |
| 2007/0152276 A1* | 7/2007 | Arnold et al. | 257/369 |
| 2007/0228480 A1 | 10/2007 | Yen et al. | |
| 2008/0242070 A1* | 10/2008 | Chen et al. | 438/587 |

OTHER PUBLICATIONS

Notice of Allowance (Mail Date Mar. 1, 2010) for U.S. Appl. No. 12/026,793, filed Feb. 6, 2008; Confirmation No. 3690.

* cited by examiner

*Primary Examiner* — Matthew Smith
*Assistant Examiner* — Christine Enad
(74) *Attorney, Agent, or Firm* — Schmeiser, Olsen & Watts; Yuanmin Cai

(57) ABSTRACT

A semiconductor structure. The semiconductor structure includes: a first semiconductor region and a second semiconductor region; a first gate dielectric region on the first semiconductor region; a second gate dielectric region on the second semiconductor region, wherein the second semiconductor region includes a first top surface shared by the second semiconductor region and the second gate dielectric region, and wherein the first top surface defines a reference direction perpendicular to the first top surface and pointing from inside to outside of the second semiconductor region; an electrically conductive layer on the first gate dielectric region; a first poly-silicon region on the electrically conductive layer; a second poly-silicon region on the second gate dielectric region; a first hard mask region on the first poly-silicon region; and a second hard mask region on the second poly-silicon region.

9 Claims, 4 Drawing Sheets

CMOS (COMPLEMENTARY METAL OXIDE SEMICONDUCTOR) DEVICES HAVING METAL GATE NFETS AND POLY-SILICON GATE PFETS

This application is a divisional application claiming priority to Ser. No. 12/026,793, filed Feb. 6, 2008, now U.S. Pat. No. 7,749,830 issued Jul. 6, 2010.

FIELD OF THE INVENTION

The present invention relates generally to CMOS (Complementary Metal Oxide Semiconductor) devices and more particularly to CMOS devices having metal gate NFETs (n-channel field effect transistors) and poly-silicon gate PFETs (p-channel field effect transistors).

BACKGROUND OF THE INVENTION

A conventional CMOS device includes an NFET and a PFET electrically coupled together in series. It is known that the operation of the CMOS device would be improved if the NFET has a metal gate electrode and the PFET has a poly gate electrode. Therefore, there is a need for a method for forming a CMOS device having a metal gate NFET and a poly-silicon gate PFET.

SUMMARY OF THE INVENTION

The present invention provides a semiconductor structure fabrication method, comprising providing a structure which includes (a) a first semiconductor region and a second semiconductor region, (b) a first gate dielectric region on the first semiconductor region and a second gate dielectric region on the second semiconductor region, (c) a high-K dielectric region having a dielectric constant K on the first gate dielectric region, K being greater than 4, (d) an electrically conductive layer on the high-K dielectric region, (e) a poly-silicon layer on the electrically conductive layer and the second gate dielectric region, and (f) a hard mask layer on the poly-silicon layer, wherein the second semiconductor region includes a first top surface shared by the second semiconductor region and the second gate dielectric region, and wherein the first top surface defines a reference direction perpendicular to the first top surface and pointing from inside to outside of the second semiconductor region; patterning the hard mask layer resulting in a first hard mask region and a second hard mask region; and etching the poly-silicon layer with the first and second hard mask regions as blocking masks until a second top surface of the electrically conductive layer and a third top surface of the second gate dielectric region are exposed to a surrounding ambient resulting in a first poly-silicon region and a second poly-silicon region, wherein the first poly-silicon region and the second poly-silicon region are exposed to a surrounding ambient.

The present invention provides a method for forming a CMOS device having a metal gate NFET and a poly-silicon gate PFET.

DETAILED DESCRIPTION OF THE INVENTION

Figure 1A:
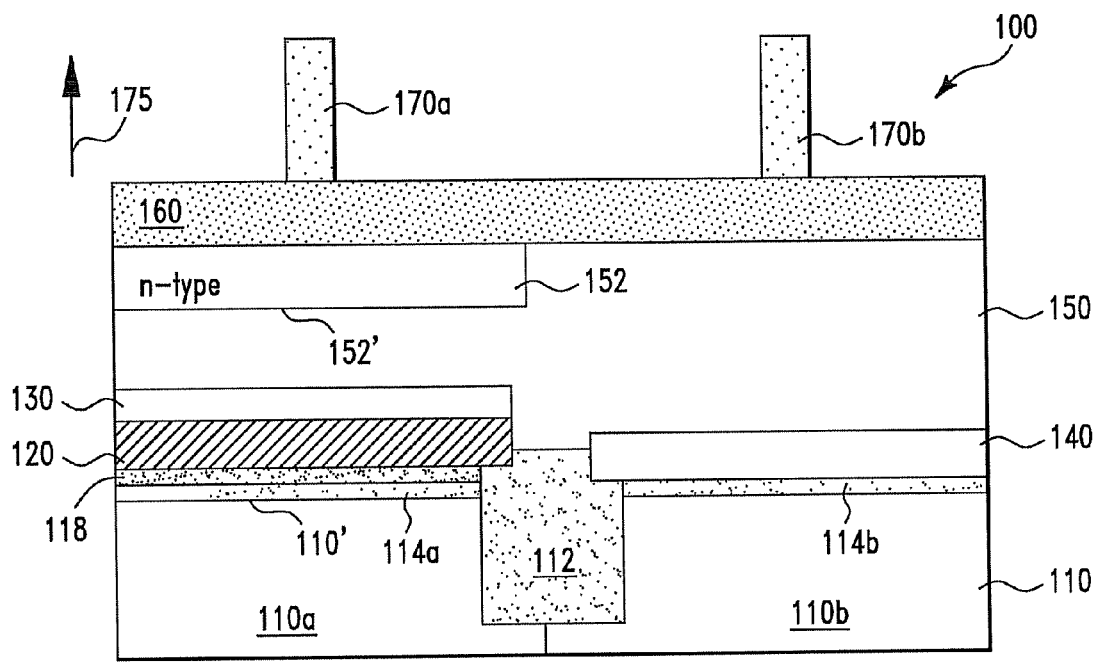
FIGS. 1A-1H show cross-section views used to illustrate a fabrication process of a semiconductor structure, in accordance with embodiments of the present invention.

FIGS. 1A-1H show cross-section views used to illustrate a fabrication process of a semiconductor structure 100, in accordance with embodiments of the present invention. More specifically, with reference to FIG. 1A, the fabrication process of the semiconductor structure 100 starts with the semiconductor structure 100 of FIG. 1A. The semiconductor structure 100 comprises a silicon substrate 110, an STI (shallow trench isolation) region 112 in the silicon substrate 110, gate dielectric regions 114a and 114b on top of the silicon substrate 110, and a high-K dielectric region 118 on the gate dielectric region 114a, as shown in FIG. 1A. The silicon substrate 110 comprises silicon regions 110a and 110b, wherein an nFET (n-channel field effect transistor) is to be formed on the silicon region 110a and a pFET (p-channel field effect transistor) is to be formed on the silicon region 110b. The gate dielectric regions 114a and 114b can be collectively referred to as a gate dielectric layer 114a+114b.

In one embodiment, the STI region 112 and the gate dielectric regions 114a and 114b comprise silicon dioxide. The high-K dielectric region 118 can comprise a high-K dielectric material, wherein K is dielectric constant. The high-K material has dielectric constant greater than 3.9 (which is dielectric constant of silicon dioxide). In one embodiment, the dielectric region 118 comprises hafnium oxide (K=25).

In one embodiment, the structure 100 further comprises an electrically conductive region 120 on the high-K dielectric region 118, an amorphous silicon region 130 on the electrically conductive region 120, and a first poly-silicon region 140 on the gate dielectric region 114b. The structure 100 also comprises a second poly-silicon layer 150 on the amorphous silicon region 130 and the first poly-silicon region 140, a hard mask layer 160 on top of the second poly-silicon region 150, and photoresist regions 170a and 170b on the hard mask layer 160. The second poly-silicon layer 150 comprises a doped poly-silicon region 152. In one embodiment, the doped poly-silicon region 152 comprises n-type dopants. The electrically conductive region 120 can comprise titanium nitride. The hard mask layer 160 can comprise silicon nitride.

In one embodiment, the entire photoresist region 170a overlaps the silicon region 110a in a direction defined by an arrow 175 (also called the direction 175). The arrow 175 is perpendicular to the top surface 110' of the silicon substrate 110. It is said that the entire photoresist region 170a overlaps the silicon region 110a in the direction 175 if, for any point of the photoresist region 170a, a straight line going through that point and being parallel to the direction 175 would intersect the silicon region 110b. In one embodiment, the entire photoresist region 170b overlaps the silicon region 110b in the direction 175.

In one embodiment, the structure 100 of FIG. 1A is formed using the processes described in the U.S. Pat. No. 6,902,969, which is hereby incorporated into this present application by reference.

Figure 1B:
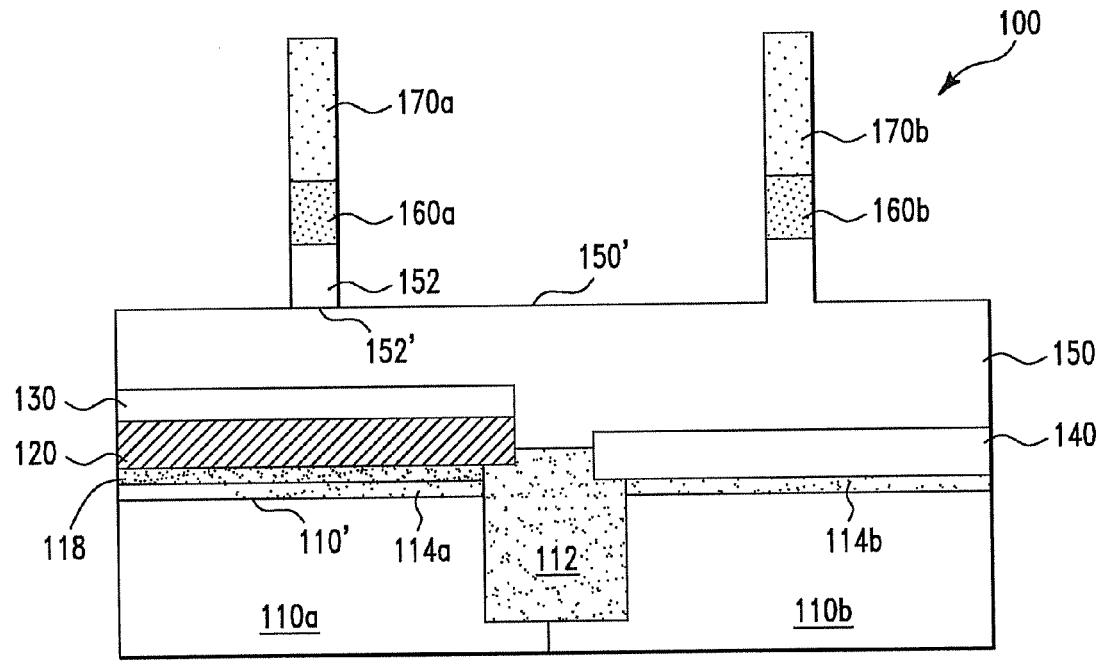

Next, after the structure 100 of FIG. 1A is formed, in one embodiment, the hard mask layer 160 and then the second poly-silicon layer 150 are etched resulting in the structure 100 of FIG. 1B. More specifically, the hard mask layer 160 and the second poly-silicon layer 150 can be anisotropically etched in a direction opposite to the direction 175 with CxFy chemistry using the photoresist regions 170a and 170b as blocking masks. The hard mask layer 160 and the second poly-silicon layer 150 are etched until the doped poly-silicon region 152 is completely etched through. In other words, the top surface 150' of the second poly-silicon 150 after the etching of the hard mask layer 160 and the second poly-silicon layer 150 is at the same level as or a lower level than the bottom surface 152' of the doped poly-silicon region 152 in the direction 175. It should be noted that, as shown in FIG. 1B, the top surface 150' of the second poly-silicon 150 is at the same level as the bottom surface 152' of the doped poly-silicon region 152. After the etching of the hard mask layer 160 and the second poly-silicon layer 150 is performed, the remaining portions of the hard mask layer 160 are hard mask regions 160a and 160b, as shown in FIG. 1B.

Figure 1C:
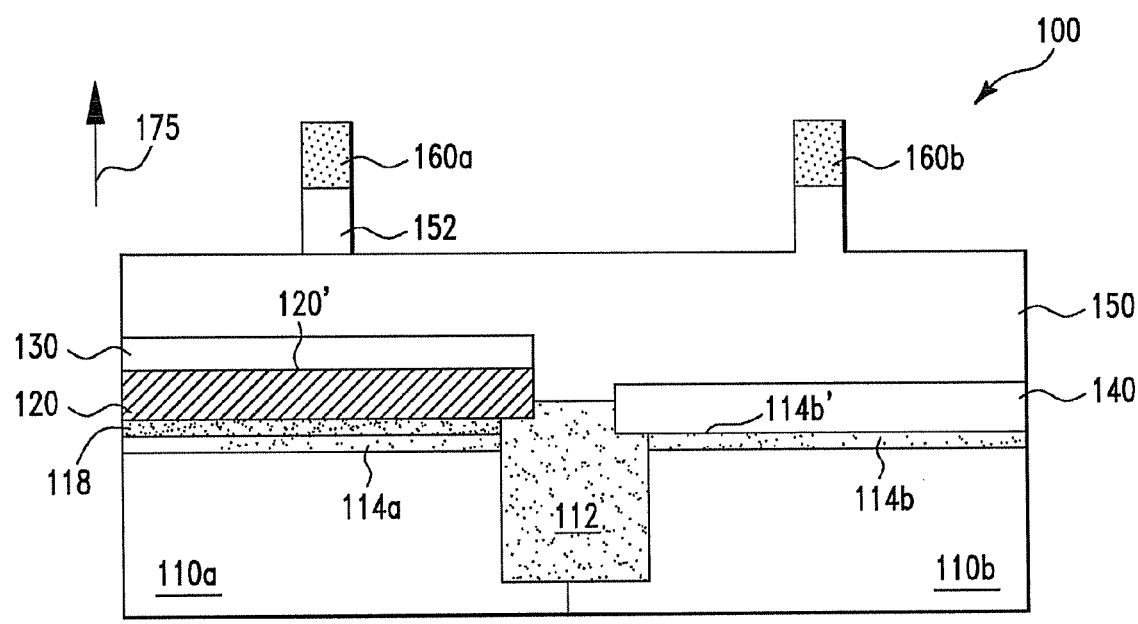

Next, with reference to FIG. 1B, in one embodiment, the photoresist regions 170a and 170b are removed resulting in the structure 100 of FIG. 1C. More specifically, the photoresist regions 170a and 170b can be removed using in-situ oxygen plasma etching process followed by a wet clean process.

Figure 1D:
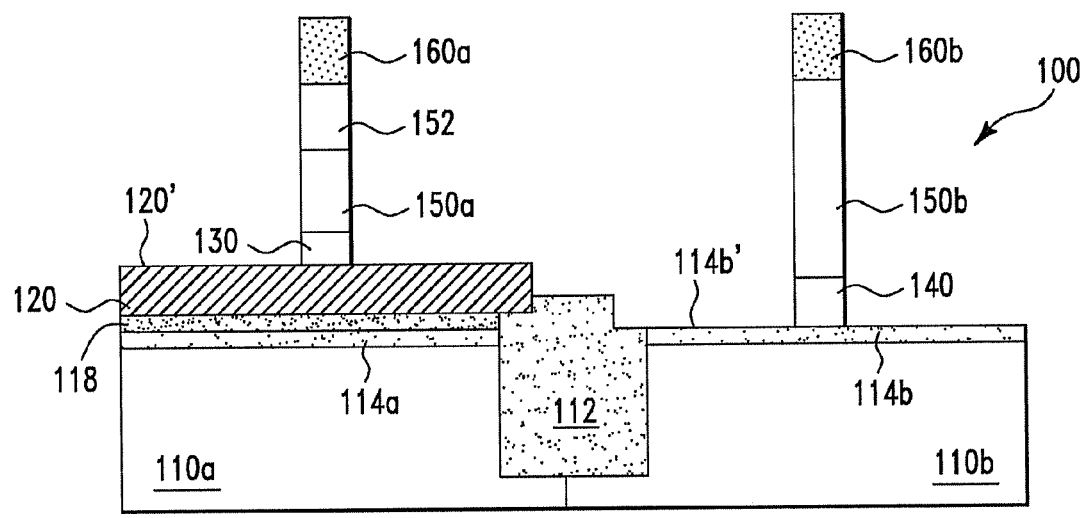

Next, with reference to FIG. 1C, in one embodiment, the second poly-silicon layer 150, the amorphous silicon region 130, and the first poly-silicon region 140 are etched such that the top surfaces 120' and 114b' of the electrically conductive region 120 and the gate dielectric layer 114b, respectively, are exposed to the surrounding ambient resulting in the structure 100 of FIG. 1D. More specifically, the second poly-silicon layer 150, the amorphous silicon region 130, and the first poly-silicon region 140 can be anisotropically etched in the direction opposite to the direction 175 using the hard mask regions 160a and 160b as blocking masks. After the etching of the second poly-silicon layer 150, the amorphous silicon region 130, and the first poly-silicon region 140 is performed, the remaining portions of the second poly-silicon layer 150 directly beneath the hard mask regions 160a and 160b are poly-silicon regions 150a and 150b, respectively. As a result of the etching the second poly-silicon layer 150, the amorphous silicon region 130, and the first poly-silicon region 140, the entire silicon region 150a and the entire amorphous silicon region 130 overlap the hard mask region 160a, whereas the entire silicon region 150a and the entire first poly-silicon region 140 overlap the hard mask region 160b.

Figure 1E:
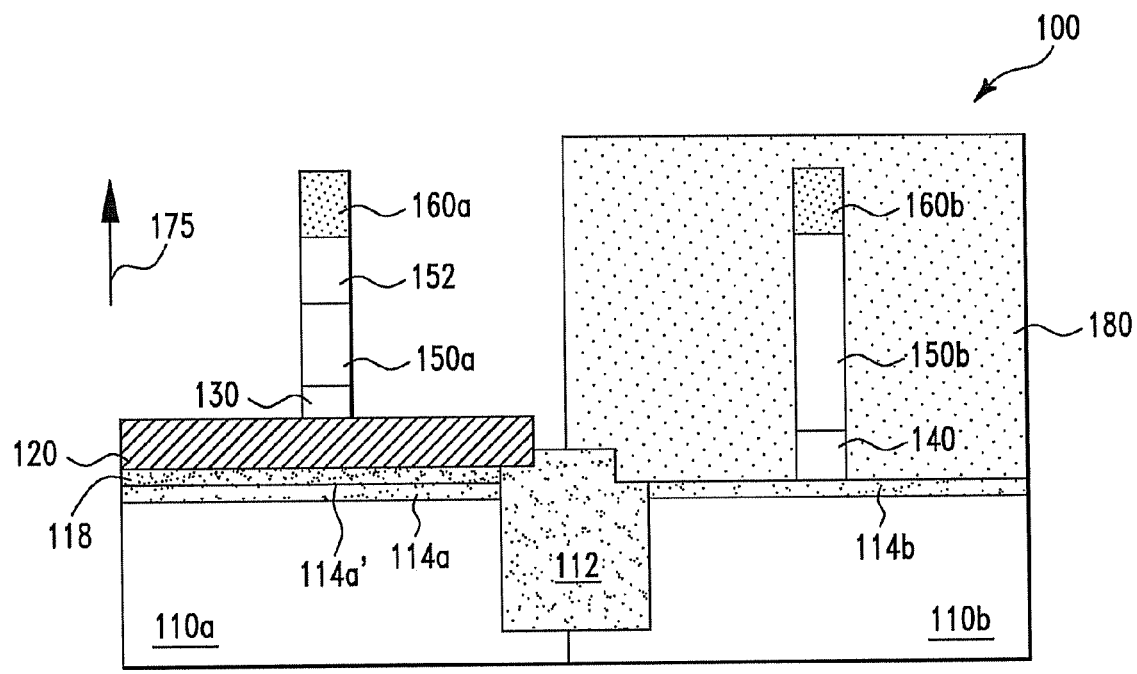

Next, with reference to FIG. 1E, in one embodiment, a photoresist region 180 is formed on top of the structure 100 of FIG. 1D such that the hard mask region 160b, the poly-silicon regions 150b and 140, and the gate dielectric region 114b are covered by the photoresist region 180, whereas the hard mask region 160a, the doped poly-silicon region 152, the poly-silicon region 150a, the amorphous silicon region 130, and the electrically conductive region 120 are not covered by the photoresist region 180. In other words, the entire hard mask region 160b, the entire poly-silicon regions 150b and 140, and the entire gate dielectric region 114b overlap the photoresist region 180 in the direction 175, whereas the hard mask region 160a, the doped poly-silicon region 152, the poly-silicon region 150a, the amorphous silicon region 130, and the electrically conductive region 120 do not overlap the photoresist region 180 in the direction 175. A first region is said to not overlap a second region in a reference direction if, for any point of the first region, a straight line going through that point and being parallel to the reference direction would not intersect the second region.

Figure 1F:
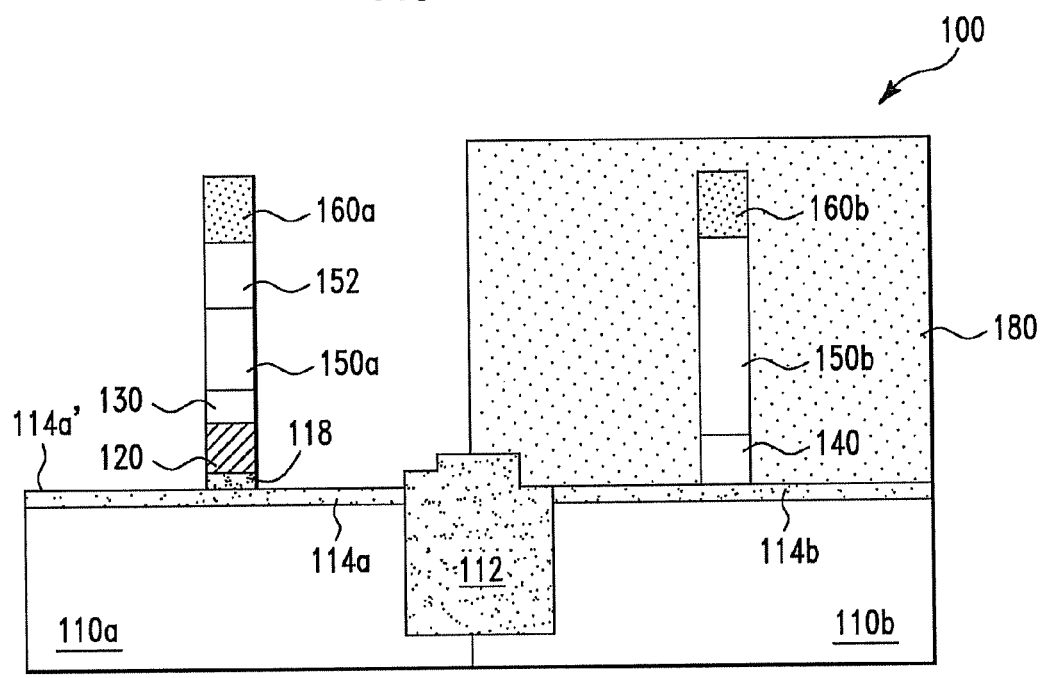

Next, in one embodiment, the electrically conductive region 120 and the high-K dielectric region 118 are etched until the top surface 114a' of the gate dielectric region 114a is exposed to the surrounding ambient resulting in the structure 100 of FIG. 1F. More specifically, the electrically conductive region 120 and the high-K dielectric region 118 can be anisotropically etched in the direction opposite to the direction 175 using the hard mask region 160a as a blocking mask.

Figure 1G:
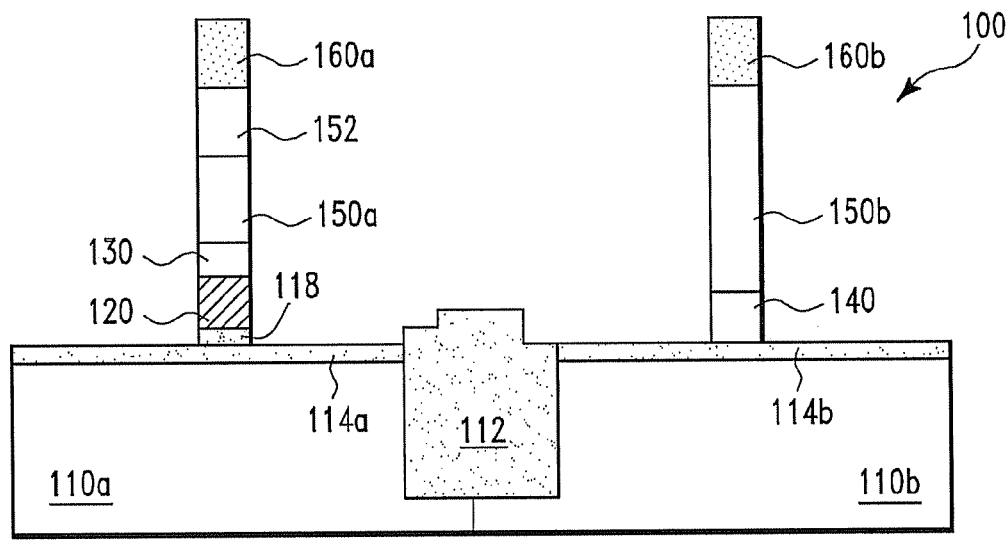

Next, with reference to FIG. 1F, in one embodiment, the photoresist region 180 is removed resulting in the structure 100 of FIG. 1G. More specifically, the photoresist region 180 can be removed by ex-situ nitrogen/hydrogen gas mix plasma etching process.

Figure 1H:
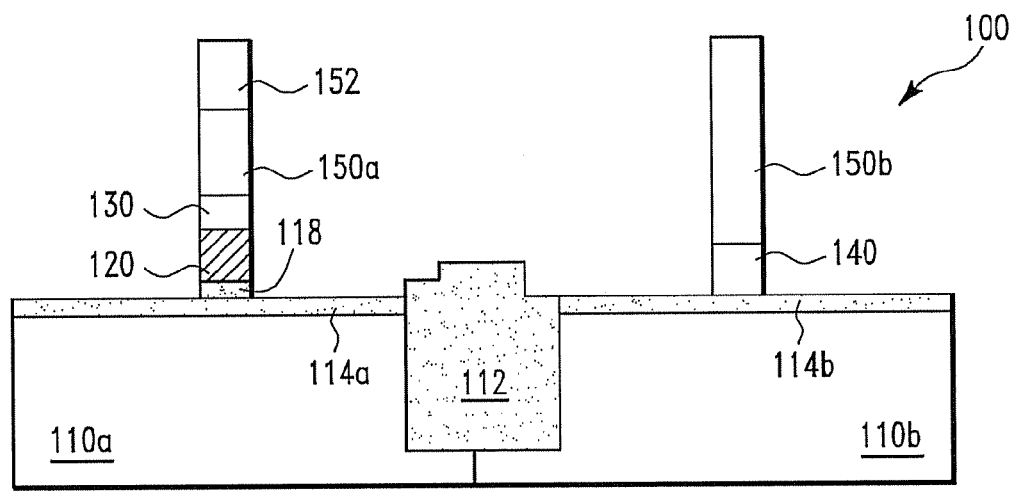

Next, with reference to FIG. 1G, in one embodiment, the hard mask regions 160a and 160b are removed resulting in the structure 100 of FIG. 1H. More specifically, the hard mask regions 160a and 160b can be removed by a wet clean process. After that, the structure 100 can undergo a post high K metal gate etch wet clean.

Next, with reference to FIG. 1H, in one embodiment, source/drain regions (not shown) of the nFET are formed in the silicon region 110a. The source/drain regions of the nFET can be doped with n-type dopants. After that, source/drain regions (not shown) of the pFET are formed in the silicon region 110b. The source/drain regions of the pFET can be doped with p-type dopants. It should be noted that the nFET is a metal gate nFET because it has a metal gate electrode region 120 which comprises titanium nitride (a metal), whereas the pFET is a poly gate pFET because it has a poly gate electrode 140+150b which comprises poly-silicon. It should be noted that the nFET and pFET can be electrically connected to form a CMOS (Complementary Metal Oxide Semiconductor) device.

In summary, described above is the fabrication process of the structure 100 which has an nFET and a pFET, wherein the nFET is a metal gate nFET and the pFET is a poly gate pFET.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:
1. A semiconductor structure, comprising:
a first semiconductor region (110a) and a second semiconductor region (110b);
a first gate dielectric region (114a) on the first semiconductor region (110a);
a second gate dielectric region (114b) on the second semiconductor region (110b),
wherein the second semiconductor region (110b) includes a first top surface shared by the second semiconductor region (110b) and the second gate dielectric region (114b), and
wherein the first top surface of the second semiconductor region (110b) defines a reference direction (175) perpendicular to the first top surface of the second semiconductor region (110b) and pointing from inside the second semiconductor region (110b) toward the second gate dielectric region (114b);
a shallow trench isolation (STI) region (112) disposed between the first semiconductor region (110a) and the second semiconductor region (110b), wherein a top surface of the STI region (112) is above the first top surface of the second semiconductor region (110b) in the reference direction (175);
an electrically conductive layer (120) on the first gate dielectric region (114a);
a first poly-silicon region (150a) on the electrically conductive layer (120);
a second poly-silicon region (150b) on the second gate dielectric region (114b);
a first hard mask region (160a) on the first poly-silicon region (150a); and
a second hard mask region (160b) on the second poly-silicon region (150b),
wherein the first poly-silicon region (150a) and the first hard mask region (160a) are exposed to a surrounding ambient, wherein the second poly-silicon region (150*b*) and the second hard mask region (160*b*) are exposed to the surrounding ambient, wherein the entire first poly-silicon region (150*a*) overlaps the electrically conductive layer (120) in the reference direction (175), and wherein the second poly-silicon region (150*b*) does not overlap the electrically conductive layer (120) in the reference direction (175).

2. The structure of claim 1, wherein the entire first poly-silicon region overlaps the first hard mask region in the reference direction, and wherein the entire second poly-silicon region overlaps the second hard mask region in the reference direction.

3. The structure of claim 1, further comprising a high-K dielectric region having a dielectric constant K sandwiched between the first gate dielectric region and the electrically conductive layer, K being greater than 4.

4. The structure of claim 1, further comprising an amorphous silicon region sandwiched between the electrically conductive layer and the first poly-silicon region.

5. The structure of claim 4, further comprising a doped poly-silicon region sandwiched between the first poly-silicon region and the first hard mask region.

6. The structure of claim 1, further comprising a doped poly-silicon region sandwiched between the first poly-silicon region and the first hard mask region.

7. The structure of claim 1, wherein a cross-sectional area of the first gate dielectric region in a first plane perpendicular to the reference direction exceeds a cross-sectional area of the electrically conductive layer in a second plane parallel to the first plane.

8. The structure of claim 1, wherein the STI region is disposed between and in direct physical contact with both the first gate dielectric region on and the second gate dielectric region.

9. The structure of claim 8, wherein the top surface of the STI region is above a top surface of the second gate dielectric region in the reference direction, and wherein the top surface of the second gate dielectric region is further from the second semiconductor region than is any other surface of the second gate dielectric region.

* * * * *